US012638883B2

(12) United States Patent
Kim et al.

(10) Patent No.: US 12,638,883 B2
(45) Date of Patent: May 26, 2026

(54) DISPLAY DEVICE

(71) Applicant: Samsung Display Co., LTD., Yongin-si (KR)

(72) Inventors: Kyungtae Kim, Hwaseong (KR); Sang-Il Park, Yongin-si (KR); Sungguk An, Suwon-si (KR); Geunwook Lee, Cheonan-si (KR); Siyun Jung, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 544 days.

(21) Appl. No.: 17/005,616

(22) Filed: Aug. 28, 2020

(65) Prior Publication Data

US 2021/0257582 A1      Aug. 19, 2021

(30) Foreign Application Priority Data

Feb. 14, 2020    (KR) ........................ 10-2020-0018604
Apr. 14, 2020    (KR) ........................ 10-2020-0045398

(51) Int. Cl.
*G06F 1/16*          (2006.01)
*B32B 7/02*          (2019.01)
(Continued)

(52) U.S. Cl.
CPC .............. *G06F 1/1637* (2013.01); *B32B 7/02* (2013.01); *B32B 7/12* (2013.01); *B32B 17/10* (2013.01);
(Continued)

(58) Field of Classification Search
CPC .......... B32B 2255/26; B32B 2307/558; B32B 17/10; B32B 7/12; B32B 2457/20; B32B 2457/202; B32B 2457/204; B32B 2457/206; G06F 1/1652; G06F 1/1641; H01L 2251/5338; H01L 51/0097; C08J 7/0427; C08J 7/046; C09D 7/62;
(Continued)

(56) References Cited

U.S. PATENT DOCUMENTS 9,155,687 B2 * 10/2015 Beckman ................. B82Y 5/00
10,510,988 B2    12/2019 Yu et al.
(Continued)

FOREIGN PATENT DOCUMENTS

CN      102464955 A      5/2012
CN      105549128 A      5/2016
(Continued)

OTHER PUBLICATIONS

English Language Translation of WO-2019078196-A1 (Year: 2019).*
European Search Report for European Patent Application No. 21155660.0 dated Jun. 29, 2021.

*Primary Examiner* — Maria V Ewald
*Assistant Examiner* — Daniel P Dillon
(74) *Attorney, Agent, or Firm* — CANTOR COLBURN LLP

(57)          ABSTRACT

A display device includes a protective layer facing a display panel with a window therebetween, and the protective layer includes in order from the window: a base layer; and a surface coating layer having a single film structure. The surface coating layer includes an impact resistance layer and an anti-fingerprint material within the impact resistance layer.

20 Claims, 10 Drawing Sheets

(51) Int. Cl.

| | |
|---|---|
| *B32B 7/12* | (2006.01) |
| *B32B 17/10* | (2006.01) |
| *B32B 33/00* | (2006.01) |
| *C09D 5/16* | (2006.01) |
| *G09F 9/30* | (2006.01) |
| *G06F 3/041* | (2006.01) |
| *H10K 102/00* | (2023.01) |

(52) U.S. Cl.
CPC .............. *B32B 33/00* (2013.01); *C09D 5/16*
(2013.01); *B32B 2255/26* (2013.01); *B32B*
*2307/518* (2013.01); *B32B 2307/558*
(2013.01); *B32B 2307/71* (2013.01); *B32B*
*2457/208* (2013.01); *G06F 3/041* (2013.01);
*H10K 2102/311* (2023.02)

(58) Field of Classification Search
CPC ................. G02B 1/14; G02F 1/133308; G02F
1/133331; G02F 2201/50
USPC ........................................................ 428/212
See application file for complete search history.

(56) References Cited

U.S. PATENT DOCUMENTS

| | | | |
|---|---|---|---|
| 10,658,615 | B2 | 5/2020 | Oh et al. |
| 10,811,623 | B2 | 10/2020 | Park et al. |
| 11,127,928 | B2 | 9/2021 | Lee et al. |
| 2012/0113361 | A1* | 5/2012 | Huang ................... G06F 3/041 |
| | | | 428/431 |
| 2013/0258261 | A1* | 10/2013 | Wang ............... G02F 1/133308 |
| | | | 349/122 |
| 2014/0186542 | A1 | 7/2014 | Park et al. |
| 2015/0266272 | A1* | 9/2015 | Lee ......................... B32B 17/10 |
| | | | 156/60 |
| 2016/0117004 | A1 | 4/2016 | Lee et al. |
| 2019/0010340 | A1* | 1/2019 | Yoon ....................... G02B 1/18 |
| 2019/0011605 | A1* | 1/2019 | Park ....................... C03C 15/00 |
| 2019/0353540 | A1 | 11/2019 | Hong et al. |
| 2020/0019001 | A1* | 1/2020 | Shibata ................. G02F 1/1333 |
| 2021/0066640 | A1 | 3/2021 | Shin et al. |

FOREIGN PATENT DOCUMENTS

| | | | | |
|---|---|---|---|---|
| CN | 107153232 | A | 9/2017 | |
| CN | 107978621 | A | 5/2018 | |
| CN | 108510889 | A | 9/2018 | |
| CN | 110502139 | A | 11/2019 | |
| EP | 3579089 | A3 | 12/2019 | |
| KR | 20180017953 | A | 2/2018 | |
| KR | 1020180129675 | A | 12/2018 | |
| KR | 20190081006 | A | 7/2019 | |
| KR | 1020210025754 | A | 3/2021 | |
| KR | 1020210075246 | A | 6/2021 | |
| KR | 1020210104516 | A | 8/2021 | |
| WO | WO-2019078196 | A1 * | 4/2019 | ............. B32B 27/00 |

* cited by examiner

DISPLAY DEVICE

This application claims priority to Korean Patent Application No. 10-2020-0018604, filed on Feb. 14, 2020 and Korean Patent Application No. 10-2020-0045398, filed on Apr. 14, 2020, and all the benefits accruing therefrom under 35 U.S.C. § 119, the entire contents of which are hereby incorporated by reference.

BACKGROUND

(1) Field

The present disclosure herein relates to a display device, and more particularly, to a foldable display device.

(2) Description of the Related Art

Electronic devices include an active area activated according to electrical signals. The electronic devices may sense inputs applied from outside the electronic devices, through the active area, while simultaneously displaying various images to provide information to users. As the electronic devices having various shapes have been developed, the active area having various shapes has been implemented.

Display modules which are flexible, such as being bendable or foldable, are being developed. These flexible display modules include flexible display panels and various functional members thereof which are flexible together with the flexible display panels. Flexible electronic devices include flexible display modules including the flexible display panels.

SUMMARY

One or more embodiment provides a display device which protects a window thereof.

An embodiment provides a display device including a display panel which generates an image, a window facing the display panel and through which the image is transmitted, and a protective layer facing the display panel with the window therebetween.

The protective layer includes in order from the window: a base layer and a surface coating layer having a single film structure. The surface coating layer includes an impact resistance layer and an anti-fingerprint material which is within the hard coating material.

In an embodiment, a display device includes a display panel which generates an image and displays the image at an active area of the display panel; a window facing the display panel and through which the image is transmitted; and a protective layer facing the display panel with the window therebetween. The protective layer, the window and the display panel are foldable and unfoldable together.

Each of the window and the protective layer includes a sidewall, the window includes a glass film, and the sidewall of the window is closer to the active area of the display panel than the sidewall of the protective layer.

The surface coating layer has a single film structure, and the surface coating layer includes an impact resistance layer and an anti-fingerprint material which is within the impact resistance layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1:
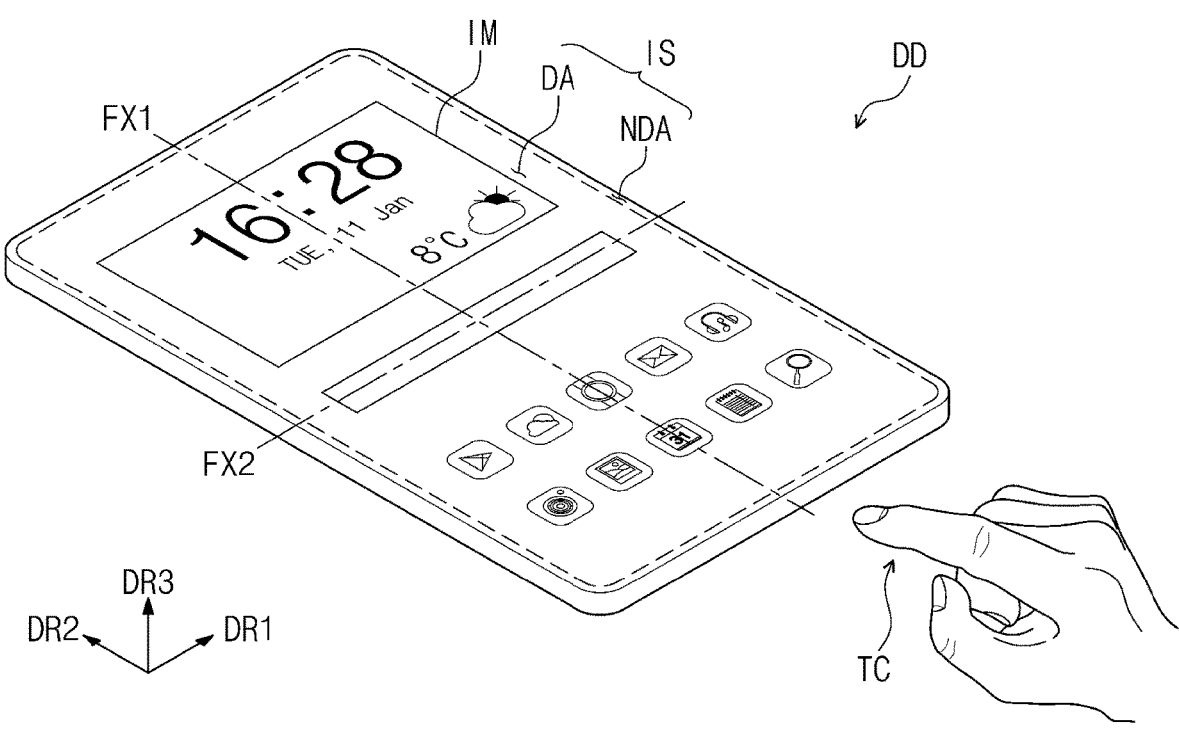
FIG. 1 is a perspective view of an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Hereinafter, embodiments will be described with reference to the drawings. In the present disclosure, when an element (or a region, a layer, a portion, etc.) is referred to as being related to another element such as being "on," "connected to" or "coupled to" another element, the element may be directly disposed on/connected to/coupled to the other element, or that a third element may be disposed therebetween. In contrast, when an element (or a region, a layer, a portion, etc.) is referred to as being related to another element such as being "directly on," "directly connected to" or "directly coupled to" another element, a third element is absent therebetween.

Like reference numerals refer to like elements. Also, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one"

do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or," includes all combinations of one or more of which associated configurations may define.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise," "include" or "have" are intended to specify the presence of stated features, integers, steps, operations, elements, components, or combinations thereof in the disclosure, but do not preclude the presence or addition of one or more other features, integers, steps, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a perspective view of an embodiment of a display device DD.

Referring to FIG. 1, a display device DD may have a rectangular shape which has short sides extended along a first direction DR1 and long sides extended along a second direction DR2 which crosses the first direction DR1. However, the shape of the display device DD is not limited thereto and the display device DD may be provided in various shapes.

The display device DD may be a foldable electronic device. Specifically, the display device DD may be foldable along folding axes extending along a direction. Hereinafter, a state of being folded along a folding axis is defined as a folded state, and a state of being flat or unfolded is defined as a non-folded state. The folding axes are rotational axes generated by folding of the display device DD. The folding axes may be defined or formed by a mechanism structure of the display device DD.

A folding axis may extend along the first direction DR1 or the second direction DR2. In an embodiment, a folding axis extending along the second direction DR2 is defined as a first folding axis FX1, and a folding axis extending along the first direction DR1 is defined as a second folding axis FX2. The display device DD may include any one or both of the first folding axis FX1 and the second folding axis FX2. That is, the display device DD may be folded along any one or both of the first folding axis FX1 and the second folding axis FX2.

The display device DD may be used for large-sized electronic display devices such as a television set and a monitor, but also used for small-sized and medium-sized electronic display devices such as a mobile phone, a tablet, a car navigation unit and a game console. These are merely presented as examples, and thus the display device DD may be adopted for other electronic devices without departing from the invention.

As shown in FIG. 1, the display device DD may display an image IM in a third direction DR3 at a display surface IS which is parallel to a plane defined by the first direction DR1 and the second direction DR2 crossing each other. The display surface IS at which the image IM is displayed may correspond to a front surface of the display device DD. A thickness of the display device DD and components thereof may be defined along the third direction DR3.

The display surface IS of the display device DD may be divided into a plurality of areas. A display area DA and a non-display area NDA may be defined for the display surface IS of the display device DD. The display device DD and various components thereof may include a display area DA and a non-display area NDA corresponding to those described above for the display surface IS.

The display area DA may be a planar area where the image IM is displayed and is viewable from outside the display device DD. The display area DA may have a rectangular shape in a view along the third direction DR3 (e.g., along a plan view). The non-display area NDA is adjacent to the display area DA. In an embodiment, the non-display area NDA may surround the display area DA in a plan view, without being limited thereto. Accordingly, the shape of the display area DA may be substantially defined by the non-display area NDA. However, the non-display area NDA may be disposed adjacent to only one side of the display area DA, or may be omitted such that the display area DA corresponds to an entirety of a planar area of the front surface of the display device DD. The display device DD may include a variety of embodiments, and is not limited to any one embodiment.

The non-display area NDA is an area adjacent to the display area DA, at which the image IM is not displayed. A bezel area of the display device DD may be defined by the non-display area NDA.

The display device DD may detect an input TC applied from outside the display device DD. The input TC (e.g., external input) includes various types of external inputs from an input tool which contacts or is provided in proximity to the display device DD, such as from a part of a user's body, light, heat pen or pressure. In an embodiment, a part of a body applied to the front surface is shown as the input TC. However, the input TC may be provided in various forms. The display device DD may sense the input TC applied to a side surface or a rear surface of the display device DD, in addition to or alternative to the front surface, according to the structure of the display device DD, and is not limited to any one embodiment.

The display device DD may activate the display surface IS to sense the input TC while displaying the image IM. In an embodiment, a planar area for sensing the input TC is illustrated as being provided in the display area DA where the image IM is displayed. However, a planar for sensing the input TC may be provided in the non-display area NDA or may be provided in all areas of the display surface IS.

Figure 2A:
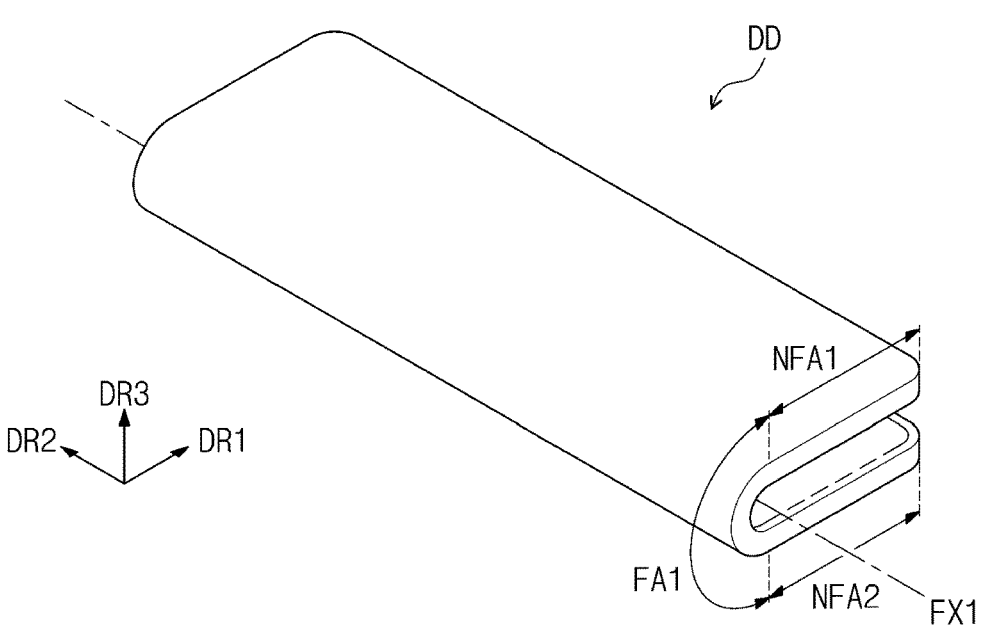
FIG. 2A is a view illustrating an embodiment of the display device shown in FIG. 1 which is in-folded about a first folding axis.
Figure 2B:
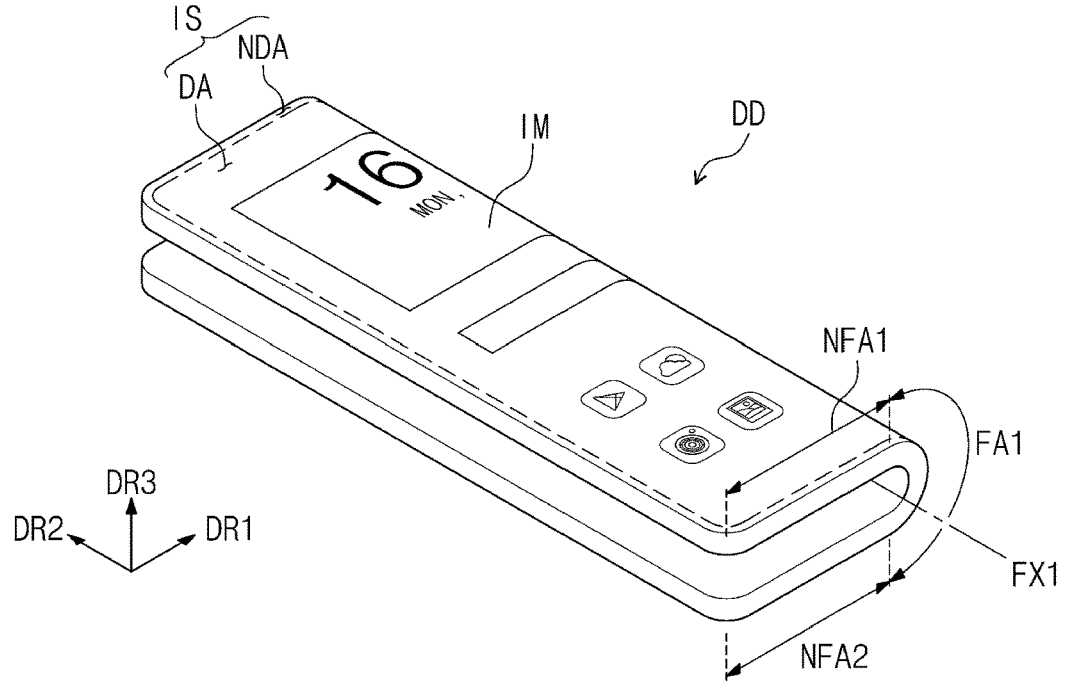
FIG. 2B is a view illustrating an embodiment of the display device shown in FIG. 1 which is out-folded about the first folding axis.

FIG. 2A is a view of the display device DD shown in FIG. 1 which is in-folded about a first folding axis FX1, and FIG. 2B is a view of the display device DD shown in FIG. 1 which is out-folded about a first folding axis FX1.

Referring to FIGS. 1 and 2A, the display device DD may be a foldable display device. The display device DD may be folded about a folding axis (e.g., a first folding axis FX1 and/or a second folding axis FX2) extending along a direction.

A plurality of planar areas may be defined in the display device DD according to an operation type thereof. The plurality of planar areas may be divided into a folding area and a non-folding area based on the first folding axis FX1. In FIGS. 1, 2A and 2B, the folding area is defined between two non-folding areas.

A first folding area FA1 is an area at which the display device DD and various components thereof are foldable about the first folding axis FX1 and is an area that forms a curvature of the display device DD and various components thereof. The first folding axis FX1 may extend along the second direction DR2, that is, along the long axis direction of the display device DD. The first folding area FA1 is defined as a planar area of the display device DD which is foldable about the first folding axis FX1 and extends along in the second direction DR2. The first folding area FA1 may extend further along the second direction DR2 than along the first direction DR1, so as to define a length along the second direction DR2 and a width along the first direction DR1, without being limited thereto.

The non-folding areas are an area at which the display device DD and various components thereof are non-foldable about the first folding axis FX1 and/or remain flat or unfolded even when the display device DD is folded. In an embodiment, the non-folding areas may include a first non-folding area NFA1 and a second non-folding area NFA2. The first non-folding area NFA1 is adjacent to a first side of the first folding area FA1 in the first direction DR1, and the second non-folding area NFA2 is adjacent to a second side of the first folding area FA1 which is opposite to the first side along the first direction DR1. That is, the display device DD which is flat, disposes the first non-folding area NFA1 opposite to the second non-folding area NFA2, along the first direction DR1, with the display area DA therebetween.

The display device DD may be in-folded or out-folded. The display device DD with is in-folded (FIG. 2A) disposes the first non-folding area NFA1 and the second non-folding area NFA2 facing each other, and the display device DD which is out-folded (FIG. 2B) disposes the first non-folding area NFA1 and the second non-folding area NFA2 facing away from each other (e.g., facing outwards). The display device DD which is out-folded disposes the first non-folding area NFA1 and the second non-folding area NFA2 facing outside of the display device DD.

The display device DD which is in-folded disposes portions of the display surface IS area to face each other, and the display device DD which is out-folded disposes portions of a rear surface which is opposite to the front surface or display surface IS to face each other.

The display device DD shown in FIG. 2A may be in-foldable such that a portion of the display surface IS at the first non-folding area NFA1 and a portion of the display surface IS at the second non-folding area NFA2 face each other. With reference to the display device DD in FIG. 1 which is flat or unfolded, the display device DD may be in-foldable by rotation of the first non-folding area NFA1 in a clockwise direction about the first folding axis FX1. In order to in-fold the display device DD such that the first non-folding area NFA1 and the second non-folding area NFA2 are aligned with each other, the first folding axis FX1 may be defined at a center of the display device DD which is taken along the first direction DR1.

Referring to FIG. 2B, the display device DD may be out-foldable about the first folding axis FX1. The display device DD may display the image IM when a portion of the display surface IS at the first non-folding area NFA1 and a portion of the display surface IS at the second non-folding area NFA2 are exposed to and face outside of the display device DD. In addition, a portion of the display surface IS at the first folding area FA1 is exposed to the outside and may display the image IM. As shown in FIG. 1, the display device DD may display the image IM in a flat or unfolded state. The first non-folding area NFA1, the second non-folding area NFA2, and the first folding area FA1 respectively display more than one of the image IM providing information independent from each other, or respectively display parts of one of the image IM.

The display device DD may be provided to be both in-foldable and out-foldable, or may be provided to be only one of in-foldable and out-foldable.

Figure 3A:
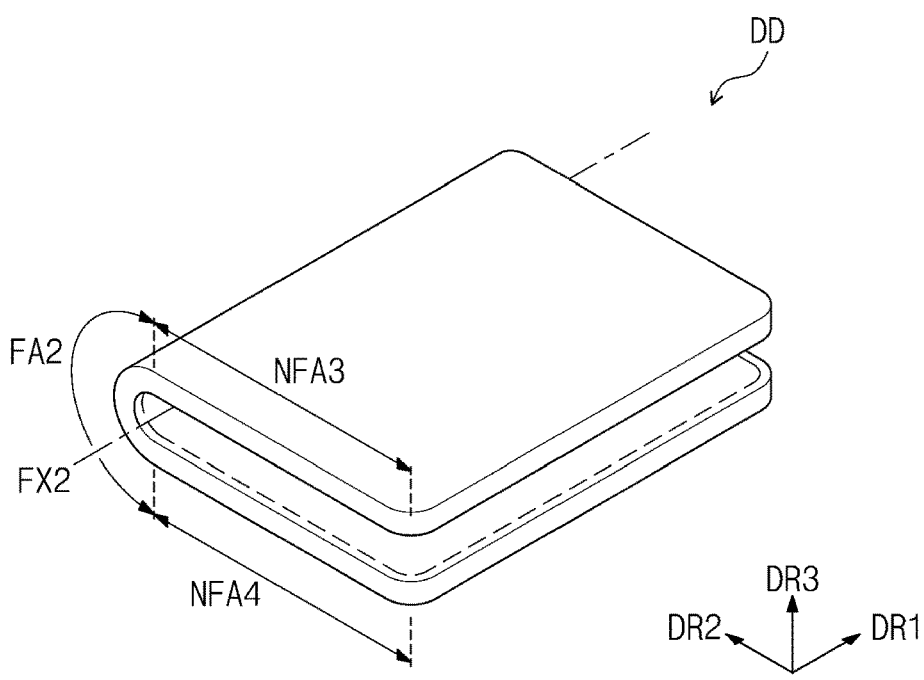
FIG. 3A is a view illustrating an embodiment of the display device shown in FIG. 1 which is in-folded about a second folding axis.
Figure 3B:
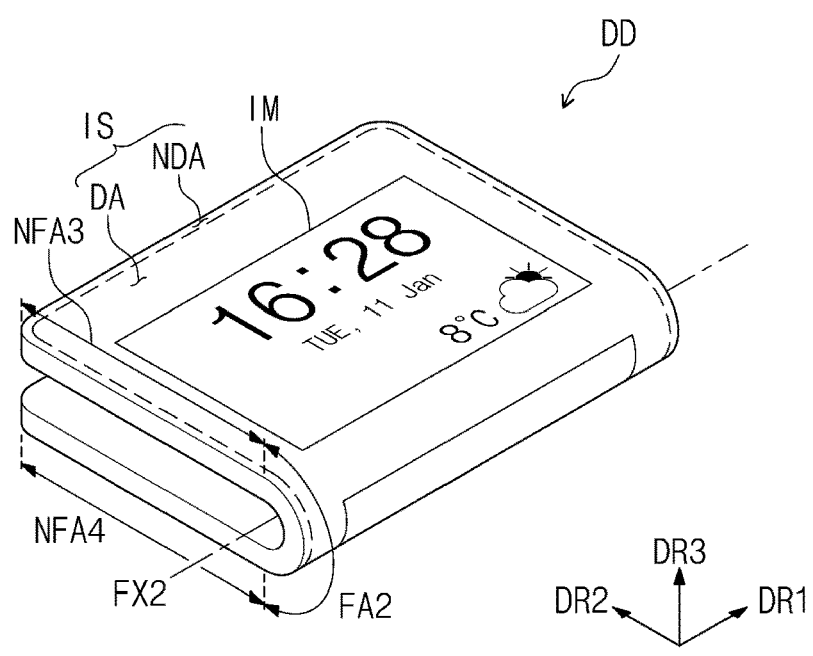
FIG. 3B is a view illustrating an embodiment of the display device shown in FIG. 1 which is out-folded about the second folding axis.

FIG. 3A is a view illustrating of the display device DD shown in FIG. 1 which is in-folded about a second folding axis FX2, and FIG. 3B is a view of the display device DD shown in FIG. 1 which is out-folded about a second folding axis FX2.

Referring to FIGS. 3A and 3B, the display device DD may be in-folded or out-folded about the second folding axis FX2. The second folding axis FX2 may extend along the first direction DR1, that is, along the short axis direction of the display device DD.

A plurality of planar areas may be defined in the display device DD according to an operation type thereof. The plurality of planar areas may be divided into a folding area and at a non-folding area based on the second folding axis FX2. In FIGS. 1, 3A and 3B, the folding area is defined between two non-folding areas.

A second folding area FA2 is an area at which the display device DD and various components thereof are foldable about the second folding axis FX2 and forms a curvature of the display device DD and various components thereof. The second folding area FA2 is defined as an area of the display device DD which is foldable about along the second folding axis FX2 and extends along in the first direction DR1. The second folding area FA2 may extend further along the first direction DR1 than along the second direction DR2, so as to define a length along the first direction DR1 and a width along the second direction DR2, without being limited thereto.

The non-folding area is an area at which the display device DD and various components thereof are non-foldable about the second folding axis FX2 and/or remain flat or unfolded even when the display device DD is folded. In an embodiment, the non-folding areas may include a third non-folding area NFA3 and a fourth non-folding area NFA4. The third non-folding area NFA3 is adjacent to a third side of the second folding area FA2 in the second direction DR2, and the fourth non-folding area NFA4 is adjacent to a fourth side of the second folding area FA2 which is opposite to the third side along the second direction DR2. That is, the display device DD which is flat, disposes the third non-folding area NFA3 opposite to the fourth non-folding area NFA4, along the second direction DR2, with the display area DA therebetween.

In an embodiment, one folding area among the first folding area FA1 and the second folding area FA2 is defined in the display device DD, but a number of folding areas of the display device DD is not limited thereto. According to another embodiment, a plurality of folding areas may be defined in a same one of the display device DD.

Figure 4:
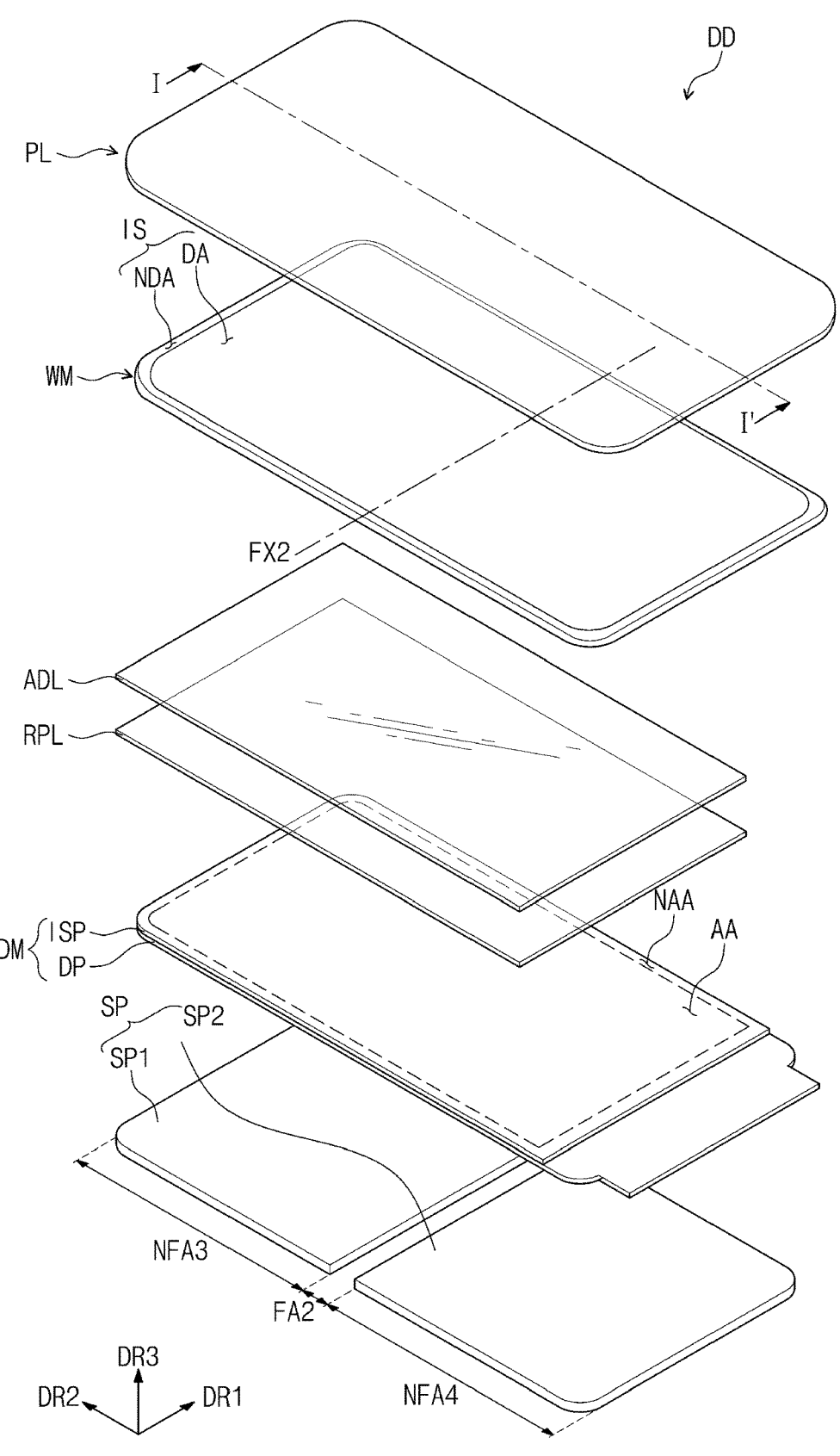
FIG. 4 is an exploded perspective view of an embodiment of a display device.
Figure 5:
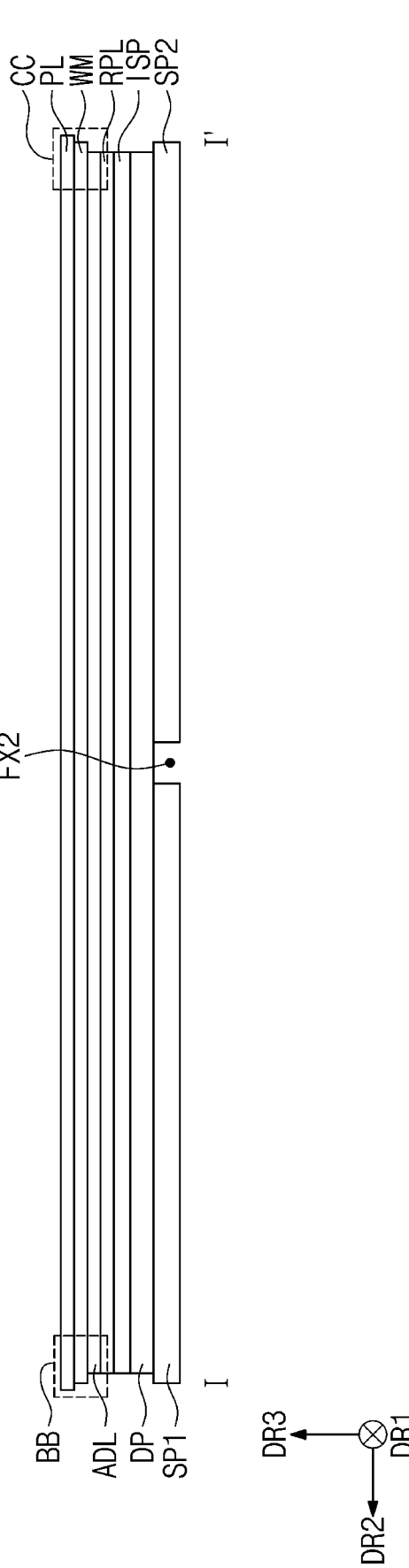
FIG. 5 is a cross-sectional view taken along line I-I' of FIG. 4.
Figure 6:
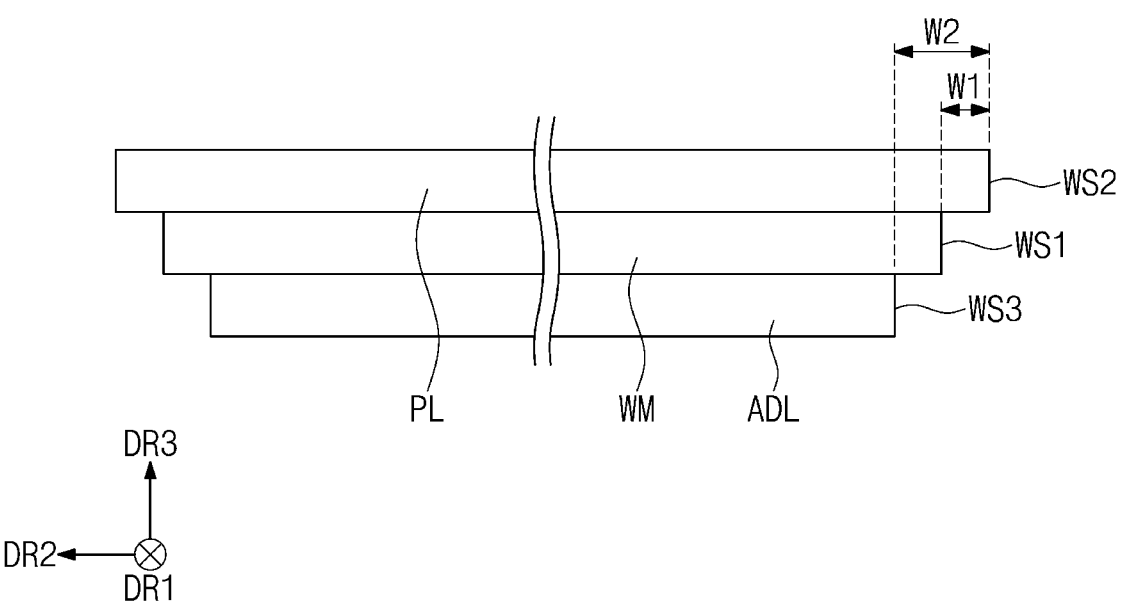
FIG. 6 is an enlarged cross-sectional view showing an embodiment of portions BB and CC shown in FIG. 5.

FIG. 4 is an exploded perspective view of an embodiment of a display device DD, FIG. 5 is a cross-sectional view taken along line I-I' of FIG. 4, and FIG. 6 is an enlarged cross-sectional view showing portions of BB and CC shown in FIG. 5. The structures in FIGS. 4, 5 and 6 show a relationship of components of the display device DD which is flat or unfolded.

Referring to FIGS. 4 and 5, the display device DD may include a display module DM for displaying an image IM, a window WM (e.g., window layer or window member) disposed on the display module DM and through which the image IM is transmitted to outside the display device DD, and a protective layer PL disposed on the window WM and through which the image IM is visible from outside the display device DD. The display module DM constitutes a part of the display device DD, and in particular, an image IM may be generated and displayed by the display module DM.

The display module DM may include a display panel DP and an input sensing layer ISP (e.g., input sensor or input sensing member). In an embodiment, the input sensing layer ISP may be a layer of the display panel DP such that the display panel DP is considered as including the input sensing layer ISP, without being limited thereto.

The display panel DP may be a light emitting display panel, and is not particularly limited. In an embodiment, for example, the display panel DP may be an organic light emitting display panel or a quantum dot light emitting display panel. An emission layer of the organic light emitting display panel may include an organic light emitting material. The emission layer of the quantum dot light emitting display panel may include a quantum dot, a quantum rod, etc. Hereinafter, the display panel DP is described as an organic light emitting display panel.

The display panel DP may be flexible. Accordingly, the display panel DP may be entirely rolled up, or folded or unfolded about the folding axis FX2.

The input sensing layer ISP may be directly disposed on the display panel DP. According to an embodiment, the input sensing layer ISP may be provided or formed on the display panel DP through a continuous process. That is, when the input sensing layer ISP is directly disposed on the display panel DP, an adhesive member is not disposed between the input sensing layer ISP and the display panel DP. In an embodiment, an adhesive member may be disposed between the input sensing layer ISP and the display panel DP. Here, the input sensing layer ISP is not provided through a continuous process with the display panel DP, and after being provided through a separate process from the display panel DP, the input sensing layer ISP may be fixed to the display panel DP such as at an upper surface of the display panel DP. The input sensing layer ISP may be fixed to the display panel DP by a fixing member or fixing layer, such as by an adhesive member.

The display panel DP generates an image IM, and the input sensing layer ISP acquires coordinate information about an input TC (e.g., a touch event).

The window WM may be disposed on the display module DM. The window WM may include an optically transparent insulating material. Accordingly, the image IM generated by the display module DM may be visible through the window WM from outside the window WM.

In an embodiment, for example, the window WM may include a glass material or a synthetic resin. When the window WM is a thin film glass (e.g., glass film), a thickness of the window WM may be about 80 micrometers (μm) or less, and may be, for example, about 30 μm, but is not limited thereto.

When the window WM is a synthetic resin film, the window WM may include a polyimide ("PI") film or a polyethylene terephthalate ("PET") film.

The window WM may have a multi-layer structure or a single-layer structure. In an embodiment, for example, the window WM may include a plurality of synthetic resin films which are bonded to each other by an adhesive, or may include a glass substrate and a synthetic resin film, which are bonded to each other by an adhesive. The window WM may include or be made of a soft material which is flexible. Accordingly, the window WM may be foldable or unfoldable about the second folding axis FX2. That is, when the shape of the display module DM is changed, the shape of the window WM may be changed together with the display module DM.

The window WM transmits an image IM from the display module DM to outside the window WM, while alleviating external shocks to the display module DM, to reduced or effectively prevent damage to or malfunctioning of the display module DM due to the external shocks. The external shocks refer to a force that causes a defect in the display module DM, such as a force applied from outside the display module DM or display device DD (e.g., an external force). The external force may include pressure or stress.

A protective layer PL is disposed on the window WM. The protective layer PL may improve impact resistance of the window WM. The protective layer PL may reduce or effectively prevent scattering of pieces of the window WM or other component which is damaged and separated into more than one piece. The protective layer PL may define an outer surface (e.g., front surface) of the display device DD.

The protective layer PL may include at least one selected from a urethane-based resin (e.g., including urethane), an epoxy-based resin (e.g., including epoxy), a polyester-based resin (e.g., including polyester), a polyether-based resin (e.g., including polyether), an acrylate-based resin (e.g., including acrylate), an acrylonitrile-butadiene-styrene resin ("ABS") and a rubber. In an embodiment, the protective layer PL may include at least one of phenylene, polyethylene terephthalate ("PET"), polyimide ("PI"), polyamide ("PAI"), polyethylene naphthalate ("PEN") and polycarbonate ("PC"). The structure of the protective layer PL will be described in detail later with reference to FIGS. 7 and 8.

At least one functional layer may be disposed between the display module DM and the window WM. In an embodiment, the functional layer may be an anti-reflection layer RPL that blocks external light reflection. The anti-reflection layer RPL may reduce or effectively prevent elements constituting the display module DM from being visible from outside the display device DD, due to external light incident through a front surface of the display device DD. The anti-reflection layer RPL may include a retarder and a polarizer. The retarder may be a film type or a liquid crystal coating type, and may include a $\lambda/2$ retarder and/or a $\lambda/4$ retarder. The polarizer may also be a film type or a liquid crystal coating type. The film type may include a stretched synthetic resin film, and the liquid crystal coating type may include liquid crystals in an arrangement. The retarder and the polarizer may be implemented as one polarizing film. The functional layer may further include a protective film disposed above or below the anti-reflection layer RPL.

The anti-reflection layer RPL may be disposed on the input sensing layer ISP. That is, the anti-reflection layer RPL may be disposed between the input sensing layer ISP and the window WM, where the input sensing layer ISP faces the window WM with the anti-reflection layer RPL therebetween. The anti-reflection layer RPL and the window WM may be bonded to each other such as through an adhesive film ADL (e.g., adhesive member). Although not shown in the drawing, an adhesive film ADL for fixing the anti-reflection layer RPL to the input sensing layer ISP may be further disposed between the input sensing layer ISP and the anti-reflection layer RPL.

The adhesive film ADL described above may include an optically clear adhesive material ("OCA"), but is not limited thereto, and may include a conventional adhesive agent or a gluing agent. In an embodiment, for example, the adhesive film ADL may include an optically clear resin ("OCR") or a pressure sensitive adhesive film ("PSA").

The display panel DP, the input sensing layer ISP, the anti-reflection layer RPL, the adhesive film ADL, the window WM and the protective layer PL are disposed in order from the support plate SP.

The display module DM may generate and display an image IM according to an electrical signal and transmit/receive information about an input TC. The display module DM may include an active area AA and a peripheral area NAA. The active area AA may be defined as a planar area at which an image IM is provided by the display module DM, at which light is emitted from the display module DM, etc.

The peripheral area NAA is adjacent to the active area AA. In an embodiment, for example, the peripheral area NAA may surround the active area AA. However, the peripheral area NAA may be defined in various shapes, and is not limited to any one embodiment. According to an embodiment, the active area AA of the display module DM may correspond to at least a part of the display area DA described above. Similarly, the peripheral area NAA may correspond to at least a part of the non-display area NDA described above.

As shown in FIGS. 4 and 5, the display device DD further includes a support plate SP disposed facing a rear surface of the display module DM and which supports the display module DM. The support plate SP may support or maintain a position of the display module DM within the display device DD without being limited thereto. The support plate SP may be a metal plate. The support plate SP may be a stainless steel plate. A strength of the support plate SP may be greater than a strength of the display module DM.

The support plate SP may include a number of support plates corresponding to the non-folding areas. In an embodiment, the support plate SP may include a first support plate SP1 and a second support plate SP2 which is spaced apart from the first support plate SP1. That is, the display device DD which is flat or unfolded disposes the first support plate SP1 and the second support plate SP2 spaced apart from each other at the second folding axis FX2.

The first support plate SP1 and the second support plate SP2 may respectively correspond to the third non-folding area NFA3 and the fourth non-folding area NFA4. That is, the first support plate SP1 is disposed corresponding to the third non-folding area NFA3 of the display module DM, and the second support plate SP2 is disposed corresponding to the fourth non-folding area NFA4 of the display module DM. The display module DM which is folded about the second folding axis FX2 disposes the first support plate SP1 and the second support plate SP2 spaced apart from each other along the second direction DR2.

The first support plate SP1 and the second support plate SP2 may be spaced apart from each other at the second folding area FA2. In an embodiment, the first support plate SP1 and the second support plate SP2 may extend from a non-folding area to partially overlap the second folding area FA2. That is, the display module DM which is flat or unfolded defines a separation distance between the first support plate SP1 and the second support plate SP2 along the second direction DR2, and the separation distance may be smaller than a width of the second folding area FA2. The second folding area FA2 may have a width along the second direction DR2.

The support plate SP may further include a connection module (not shown) for connecting the first support plate SP1 and the second support plate SP2 to each other. The connection module may include a hinge module or a multi-joint module.

In FIGS. 4 and 5, the support plate SP is provided with two support plates, but is not limited thereto. That is, when the number of the second folding axis FX2 increases or is more than one, the support plate SP may include a plurality of support plates separated at respective ones of the second folding axis FX2.

In FIG. 4, the support plate SP is illustrated to have a structure divided into the first support plate SP1 and the second support plate SP2, but is not limited thereto. That is, the support plate SP may be provided or formed as a single plate disposed corresponding to each of the third non-folding area NFA3, the fourth non-folding area NFA4 and the second folding area FA2. The support plate SP which is provided as a single plate may include a plurality of holes extended through a thickness of the support plate SP at the second folding area FA2.

A buffer film (not shown) may be further disposed between the display module DM and the support plate SP. The buffer film may include a polymer material. The buffer film may be a layer for absorbing shock applied from outside the display device DD. The buffer film may be bonded to the display module DM and the support plate SP, respectively, such as through an adhesive film ADL.

Each of the protective layer PL, the window WM and the adhesive film ADL may include an upper surface furthest from the display panel DP, a lower surface closest to the display panel DP, and a side surface connecting the upper surface to the lower surface. Each of the protective layer PL, the window WM and the adhesive film ADL defines a distance between opposing side surfaces. As shown in FIGS. 4 to 6, a distance between side surfaces of the protective layer PL which are opposite to each other along the second direction DR2, may be greater than a distance between side surfaces of each of the window WM and the adhesive film ADL.

The relative shapes and structures in FIG. 6 are shown in a view along the first direction DR1. It will be understood that the relative shapes and structures may also be applied in a view along the second direction DR2. The adhesive film ADL faces the protective layer PL with the window WM therebetween. The window WM may form an interface with the adhesive film ADL and with the protective layer PL, without being limited thereto.

As shown in FIGS. 4 to 6, a first sidewall WS1 (e.g., first side surface) of the window WM may be disposed inwardly from a second sidewall WS2 (e.g., second side surface) of the protective layer PL. The second sidewall WS2 may extend further than the first sidewall WS1, along the display module DM. Being disposed inwardly may indicate being closer to the active area AA of the display panel DP than other comparison objects, or further from an outer edge (or end) of the display device DD. In a direction along the display panel DP, the first sidewall WS1 of the window WM is disposed closer to the active area AA than the second sidewall WS2 of the protective layer PL. That is, the first sidewall WS1 of the window WM may protrude less than the second sidewall WS2 of the protective layer PL, with respect to the active area AA. The protective layer PL which extends further than an outer edge or end of the window WM defines an extended portion of the protective layer PL. Therefore, the protective layer PL may block external shocks from being delivered to the first sidewall WS1 of the window WM, and as a result, the chances of having cracks in the window WM may be reduced.

The first sidewall WS1 of the window WM may be disposed inwardly from the second sidewall WS2 of the protective layer PL by a first width W1. The first width W1 may refer to a distance along the first direction DR1 and/or the second direction DR2. In addition, along a plane defined by the first direction DR1 and the second direction DR2, the first width W1 may correspond to a distance between the first sidewall WS1 of the window WM and the second sidewall WS2 of the protective layer PL. A length of the extended portion of the protective layer PL may be defined by the first width W1.

The first width W1 may be about 196 μm, but is not limited thereto. In an embodiment, for example, the first width W1 may be about 50 μm to about 300 μm. When the first width W1 increases, the second sidewall WS2 of the protective layer PL protrudes further than the first sidewall WS1 of the window WM, and as a result, the chances of having cracks in the window WM is further reduced.

In addition, an adhesive film ADL is disposed on a rear surface of the window WM. A third sidewall WS3 of the adhesive film ADL may be disposed inwardly from the second sidewall WS2 of the protective layer PL. The first sidewall WS1 may extend further than the third sidewall WS3, along the display module DM. Being disposed inwardly may indicate being closer to the active area AA than other comparison objects. The third sidewall WS3 of the adhesive film ADL may protrude less than the first sidewall WS1 of the window WM, with respect to the active area AA. The window WM which extends further than an outer edge or end of the adhesive film ADL defines an extended portion of the window WM.

The third sidewall WS3 of the adhesive film ADL may be disposed inwardly from the second sidewall WS2 of the protective layer PL by a second width W2. The second width W2 may correspond to a distance between the second sidewall WS2 of the protective layer PL and the third sidewall WS3 of the adhesive film ADL. The second width W2 may refer to a distance along the first direction DR1 and/or the second direction DR2.

In addition, the second width W2 may be greater than or equal to the first width W1. That is, when the second width W2 is greater than the first width W1, the third sidewall WS3 of the adhesive film ADL may be disposed inwardly from the first sidewall WS1 of the window WM. The second width W2 may be about 392 μm, but is not limited thereto. In an embodiment, for example, the second width W2 may be about 292 μm to about 492 μm, but is not limited thereto.

When the second width W2 is equal to the first width W1, the third sidewall WS3 of the adhesive film ADL and the first sidewall WS1 of the window WM may be disposed on a same line, that is, coplanar with each other.

Figure 7:
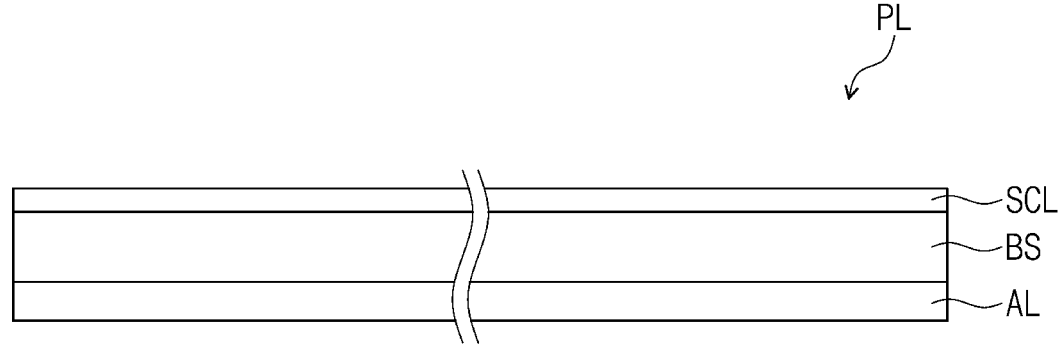
FIG. 7 is a cross-sectional view showing an embodiment of a protective layer.
Figure 8:
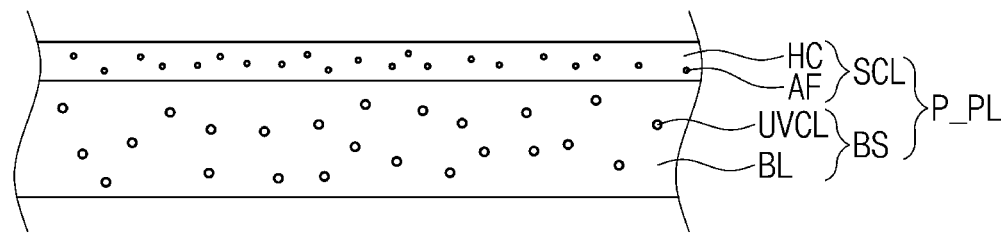
FIG. 8 is an enlarged cross-sectional view showing an embodiment of a surface coating layer and a base layer shown in FIG. 7.

FIG. 7 is a cross-sectional view showing an embodiment of a protective layer PL, and FIG. 8 is an enlarged cross-sectional view showing an embodiment of a surface coating layer SCL and a base layer BS shown in FIG. 7.

Referring to FIGS. 7 and 8, the protective layer PL includes the base layer BS, the surface coating layer SCL and an adhesive layer AL.

The base layer BS may include a base material BL. The base material BL may include at least one of phenylene, polyethylene terephthalate ("PET"), polyimide ("PI"), polyamide ("PAI"), polyethylene naphthalate ("PEN") and polycarbonate ("PC").

The base layer BS may further include an ultraviolet ("UV") light blocking material UVCL which is in the base material BL. In an embodiment, the UV light blocking material UVCL may include inorganic chemical materials such as zinc oxide (ZnO) or titanium dioxide (TiO$_2$). The UV light blocking material UVCL may function to reflect or scatter UV light rays. As such, the inclusion of the UV light blocking material UVCL in the base layer BS may allow the protective layer PL to have a UV light blocking function. In an embodiment, the protective layer PL including both the UV light blocking material UVCL and the base material BL may transmit less than about 20% of UV light rays having a wavelength of about 380 nanometers (nm) or less. That is, the protective layer PL has a transmission of less than about 20% with respect to UV light rays having a wavelength of about 380 nm or less. When the window WM includes a thin film glass, a UV light blocking function at the window WM may not be good (e.g., minimal). In one or more embodiment of the protective layer PL, the inclusion of the UV light blocking material UVCL in the base layer BS may provide a UV light blocking function by the protective layer PL.

In an embodiment, the base layer BS may have a thickness of about 40 μm to about 70 μm. The base layer BS may have a thickness of about 45 μm to about 60 μm, but is not limited thereto. The thickness of the base layer BS may include a total thickness or maximum thickness of the base material BL (e.g., base material layer) having the UV light blocking material UVCL.

A surface coating layer SCL may include a hard coating material HC and an anti-fingerprint material AF which is in the hard coating material HC. The hard coating material HC may provide an impact resistance layer and/or a scratch resistance layer of the protective layer PL, without being limited thereto. That is, the surface coating layer SCL may provide an impact resistance layer and/or a scratch resistance layer of the protective layer PL. The surface coating layer SCL has a single film structure. That is, the surface coating layer SCL includes one layer (e.g., single layer) including both of the hard coating material HC and the anti-fingerprint material AF. The hard coating material HC may include a high strength material having pencil hardness of F or higher. In an embodiment, the hard coating material HC may include at least one of a siloxane resin, an epoxy resin and an acryl-based resin (e.g., including acryl).

The siloxane resin may include silsesquioxane, a siloxane material, and inorganic particles surface-treated with silane. Silsesquioxane may be a ladder type silsesquioxane. Silsesquioxane may be included in an amount of about 30 weight percent (wt %) to about 60 wt % with respect to a total weight of the hard coating material HC. When silsesquioxane is included at less than about 30 wt %, the flexibility of the surface coating layer SCL may be insufficient (e.g., too hard or inflexible), and when silsesquioxane is included at greater than about 60 wt %, the surface hardness of the surface coating layer SCL may be ineffective (e.g., too flexible and not hard).

The siloxane material may have at least one acrylate functional group. In an embodiment, for example, the siloxane material may have an acrylate group as a terminal group. In an embodiment, for example, the siloxane material may be a siloxane polymer or a siloxane oligomer, which have an acrylate group as a terminal group. In an embodiment, the siloxane material may be provided as a polymer integrally formed with silsesquioxane.

The siloxane material may be included in an amount of about 10 wt % to about 40 wt % with respect to the total weight of the hard coating material HC. When the siloxane material is included a less than about 10 wt %, the surface hardness and strength of the surface coating layer SCL may be reduced, and when the siloxane material is included at greater than about 40 wt %, the brittleness of the surface coating layer SCL becomes greater, thereby reducing flexibility and increasing chances of cracks generated during bending of the surface coating layer SCL.

The hard coating material HC may include surface-treated inorganic particles. The surface-treated inorganic particles may be inorganic particles surface-treated with silane (e.g., silane-treated inorganic particles). In an embodiment, the inorganic particles surface-treated with silane may be inorganic particles surface-treated with a silane coupling agent. In an embodiment, for example, an average size of the inorganic particles may be about 10 nm to about 50 nm. The average size of the inorganic particles may indicate the average diameter of the inorganic particles, without being limited thereto. In an embodiment, for example, the average diameter of the inorganic particles may be about 10 nm to about 30 nm.

In an embodiment, when the average size of the inorganic particles is greater than about 50 nm, the optical transparency of the surface coating layer SCL may be deteriorated. In addition, when the average size of the inorganic particles is less than about 10 nm, the surface hardness in the surface coating layer SCL may be deteriorated.

The inorganic particles may include $SiO_2$, $TiO_2$, $Al_2O_3$, $ZrO_2$, ZnO, AlN, $Si_3N_4$, or combinations thereof. That is, the inorganic particles may include at least one of $SiO_2$, $TiO_2$, $Al_2O_3$, $ZrO_2$, ZnO, AlN and $Si_3N_4$. In an embodiment, the hard coating material HC is $SiO_2$ surface-treated with silane, $TiO_2$ surface-treated with silane, $Al_2O_3$ surface-treated with silane, $ZrO_2$ surface-treated with silane, ZnO surface-treated with silane, AlN surface-treated with silane, or $Si_3N_4$ surface-treated with silane, or combinations thereof.

In an embodiment, the hard coating material HC may include about 10 wt % to about 30 wt % of inorganic particles surface-treated with silane with respect to the total weight of the hard coating material HC. When the inorganic particles are less than 10 wt %, the surface hardness and strength of the surface coating layer SCL may be reduced, and when the inorganic particles are greater than 30 wt %, the compatibility of the inorganic particles may be reduced.

The epoxy resin or the acrylic resin is a monomer or an oligomer including at least one of an epoxy group, an oxetane group, an acrylate group, a methacrylate group, a urethane acrylate group and an ethyleneoxide ("EO") addition acrylate group, and may have flexibility. To be more specific, the epoxy resin may be at least one selected from a glycidyl-type epoxy resin, an alicyclic epoxy resin and an oxetane-based resin (e.g., including oxetane).

The glycidyl-type epoxy resin may be a bisphenol A-type epoxy resin, a bisphenol F-type epoxy resin, a bisphenol S-type epoxy resin, a naphthalene-type epoxy resin or hydrogenated product thereof, an epoxy resin having a dicyclopentadiene skeleton, an epoxy resin having a triglycidyl isocyanurate skeleton, an epoxy resin having a cardo skeleton, or an epoxy resin having a polysiloxane structure.

The alicyclic epoxy resin may be 3,4-epoxycyclohexyl-methyl-3', 4'-epoxycyclohexanecarboxylate, 1,2,8,9-diepoxylimonene, 3,4-epoxycyclohexylmethanol and 3,4-epoxycyclohexanecarboxylic acid ester-bonded to both ends of the ε-caprolactone oligomer, respectively, or an epoxy resin having a hydrogenated bisphenol A skeleton.

The oxetane-based resin may be an oxetane resin having a hydroxy structure and an oxetane resin having a methoxy methyl benzene structure.

The acryl-based resin is a monomer or an oligomer including at least one selected from an acrylate group, a methacrylate group, a urethane acrylate group, and an ethyleneoxide ("EO") addition acrylate group.

In an embodiment, for example, the acryl-based resin includes bisphenol-A ethylene oxide diacrylate, bisphenol-A ethylene oxide dimethacrylate, bisphenol-A ethoxylate diacrylate, bisphenol-A ethoxylate diacrylate, bisphenol-A poly ethoxylate diacrylate, bisphenol-A diacrylate, bisphenol-S diacrylate, dicyclopentadienyl diacrylate, pentaerythritol triacrylate, tris(2-hydroxyethyl) isocyanurate triacrylate, pentaerythritol tetraacrylate, bisphenol-A dimethacrylate, bisphenol-S dimethacrylate, dicyclopentadienyl dimethacrylate, pentaerythritol trimethacrylate, tris(2-hydroxy ethyl) isocyanurate trimethacrylate, or pentaerythritol tetramethacrylate.

The anti-fingerprint material AF may include a water-repellent material or an oil-repellent material to improve the fouling resistance of the surface coating layer SCL. In an embodiment, the anti-fingerprint material AF may be inorganic particles including a fluorine-based material (e.g., including fluorine). The fluorine-based material may include one of polytetra fluoroethylene ("PTFE"), polyvinylidene fluoride ("PVDF") and amorphous fluorine.

The surface coating layer SCL may have a surface contact angle of about 100 degrees (°) to about 120° provided by the anti-fingerprint material AF. The surface contact angle may vary according to the weight ratio of the anti-fingerprint material AF to a total weight of the surface coating layer SCL. In an embodiment, the anti-fingerprint material AF may have a weight ratio of greater than 0 wt % to about 10 wt % or less with respect to a total weight of the surface coating layer SCL. When the anti-fingerprint material AF has a weight ratio greater than about 10 wt %, the surface hardness of the surface coating layer SCL may be reduced.

The surface coating layer SCL may have a thickness of about 3 μm to about 10 μm. The surface coating layer SCL may have a thickness of about 4 μm to about 6 μm, but is not limited thereto. When the thickness of the surface coating layer SCL is greater than about 10 μm, flexibility of the surface coating layer SCL may be reduced, and when the thickness of the surface coating layer SCL is less than about 3 μm, the surface hardness of the surface coating layer SCL may be reduced.

A layer in which the base layer BS and the surface coating layer SCL are bonded (hereinafter referred to as a preliminary protective layer P_PL for convenience of description) may have an elastic modulus of about 4.0 gigapascals (GPa) to about 5.5 GPa. The preliminary protective layer P_PL may be an optical axis control stretched film. Within the optical axis control stretched film, a difference between the elastic modulus along the first stretch axis and the elastic modulus along the second stretch axis of the preliminary protective layer P_PL may be within about 2 GPa. In an embodiment, a difference between the elastic modulus along the first stretch axis and the elastic modulus along the second stretch axis of the preliminary protective layer P_PL may be less than about 1 GPa. When a difference between the elastic modulus along the first stretch axis and the elastic modulus along the second stretch axis of the preliminary protective layer P_PL is greater than about 1 GPa, shrinkage deformation of the preliminary protective layer P_PL may increase.

An adhesive layer AL may be disposed on a rear surface of the base layer BS. The adhesive layer AL is disposed facing the surface coating layer SCL with the base layer BS therebetween. The adhesive layer AL may include a pressure-sensitive adhesive material, however, is not limited thereto. The adhesive layer AL may include an optically clear adhesive resin. In an embodiment, the adhesive layer AL may have a thickness of about 10 μm to about 50 μm, but is not limited thereto.

Further, a total light transmittance of the protective layer PL may be about 90% or greater, and may have a haze value less than or equal to about 1%. When the haze value is greater than about 1%, the light transmittance of the protective layer PL may be deteriorated.

Figure 9A:
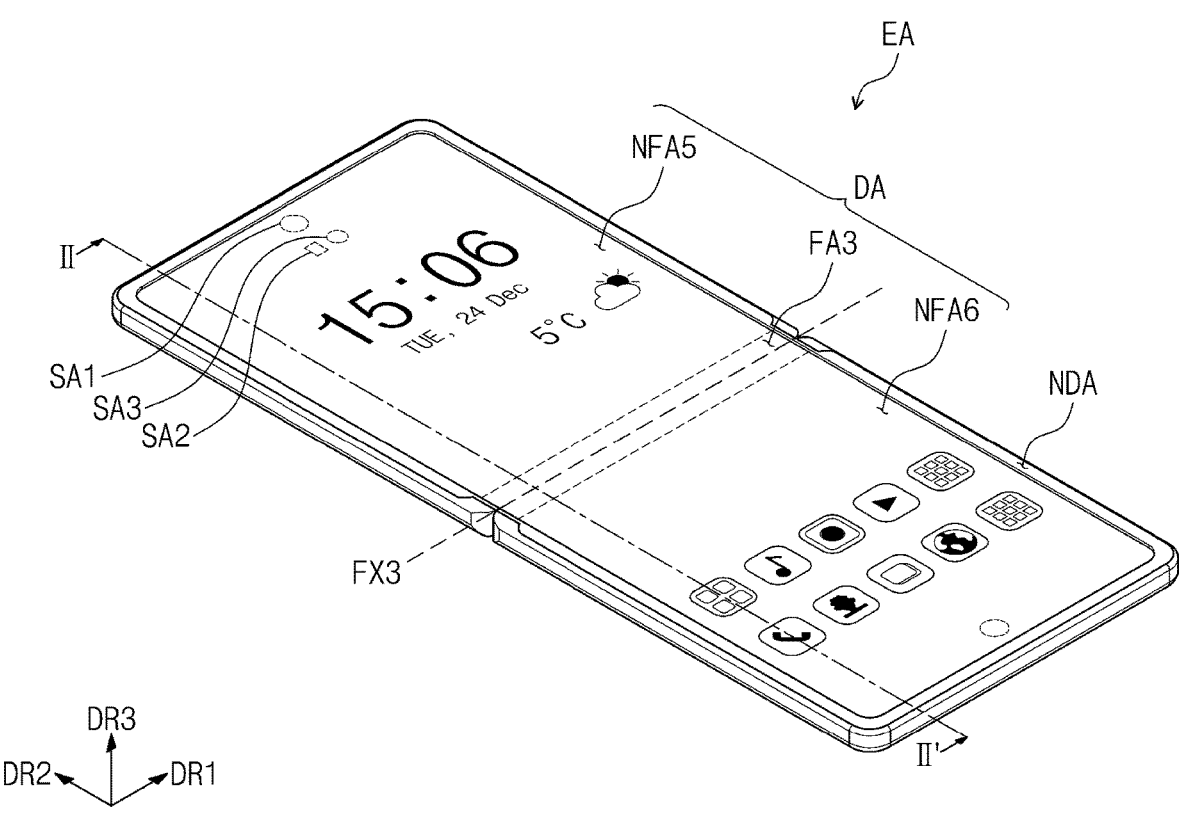
FIG. 9A is a perspective view of an embodiment of an electronic device which is unfolded.
Figure 9B:
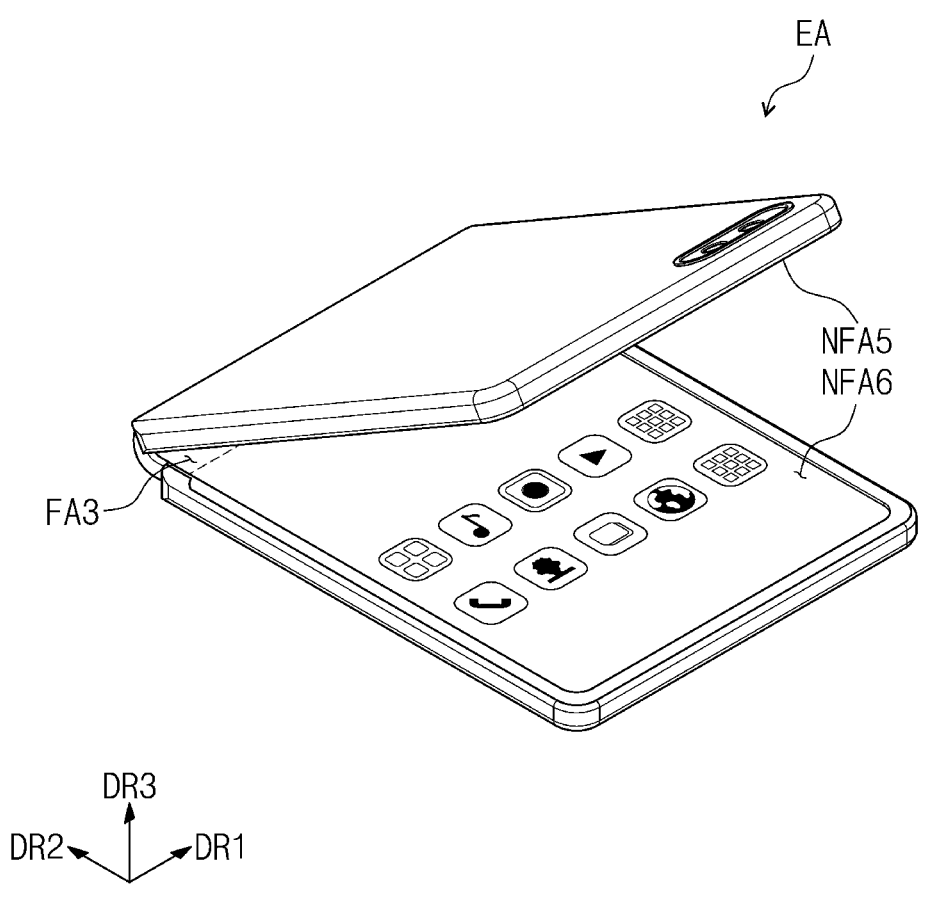
FIG. 9B is a perspective view of an embodiment of an electronic device which is folded.

FIG. 9A is a perspective view of an embodiment of an electronic device EA. FIG. 9B is a perspective view of an embodiment of the electronic device EA. FIG. 9A illustrates the electronic device EA which is flat or unfolded, and FIG. 9B illustrates the electronic device EA which is folded.

Referring to FIGS. 9A and 9B, an electronic device EA may be a device activated according to an electrical signal. In an embodiment, for example, the electronic device EA may be a mobile phone, a tablet, a car navigation unit, a game console or a wearable device, but is not limited thereto. In FIG. 9A, a mobile phone is illustrated as the electronic device EA.

The electronic device EA may display an image IM at a display area DA. The electronic device EA which is unfolded disposes the display area DA in a plane parallel to a plane defined by the first direction DR1 and the second direction DR2 which cross each other. The electronic device EA may include a display area DA and a non-display area NDA corresponding to those described above for the display device DD.

The display area DA may include a third folding area FA3, a fifth non-folding area NFA5 and a sixth non-folding area NFA6. The electronic device EA is bendable at the third folding area FA3 about a third folding axis FX3 extending along the first direction DR1. The third folding area FA3 is disposed between the fifth non-folding area NFA5 and the sixth non-folding area NFA6, along the second direction DR2.

In the electronic device EA which is folded (FIG. 9B), the fifth non-folding area NFA5 and the sixth non-folding area NFA6 may face each other. Therefore, the electronic device EA which is fully folded disposes portions of the display area DA facing each other (e.g., not exposed to outside of the electronic device EA), which may be referred to as in-folding of the electronic device EA. However, this is merely an example and a folding operation of the electronic device EA is not limited thereto.

In an embodiment, for example, the electronic device EA which is folded may dispose portions of the display area DA facing outside the electronic device EA, which may be referred to as out-folding of the electronic device EA.

In FIGS. 9A and 9B, one of the third folding area FA3 and two non-folding areas is shown, but the number of folding areas and non-folding areas is not limited thereto. In an embodiment, for example, the electronic device EA may include more than two non-folding areas and a plurality of folding areas which are disposed between adjacent non-folding areas.

FIGS. 9A and 9B illustrate that the third folding axis FX3 is parallel to a short axis of the electronic device EA, but is not limited thereto. In an embodiment, for example, the third folding axis FX3 may extend along a long axis of the electronic device EA, for example, along the second direction DR2.

The electronic device EA may include a sensing area provided in plural. In FIG. 9A, three sensing areas are shown, but the number of the sensing areas is not limited thereto.

The plurality of sensing areas may include a first sensing area SA1, a second sensing area SA2 and a third sensing area SA3 to define three sensing areas. The first sensing area SA1, the second sensing area SA2 and the third sensing area SA3 may respectively overlap or correspond to a plurality of electronic modules. In an embodiment, for example, the first sensing area SA1 may overlap a camera module, and the second sensing area SA2 and the third sensing area SA3 may each overlap a proximity illuminance sensor, but are not limited thereto.

The electronic modules may respectively receive external inputs from outside the electronic device EA, and transmitted through the first sensing area SA1, the second sensing area SA2 or the third sensing area SA3 to the electronic device EA. The electronic modules may provide an output from the electronic device EA, through the first sensing area SA1, the second sensing area SA2 or the third sensing area SA3, to outside the electronic device EA.

The sensing area may be a non-display region at which an image IM is not displayed or may be a display region at which an image IM is displayed. In an embodiment, the first sensing area SA1 may be surrounded by the display area DA, and the second sensing area SA2 and the third sensing area SA3 may be included in the display area DA. That is, the second sensing area SA2 and the third sensing area SA3 may display an image IM, e.g., a display region. In contrast, the first sensing area SA1 may not display an image IM, e.g., a non-display region. The light transmittance at planar areas of each of the first sensing area SA1, the second sensing area SA2 and the third sensing area SA3 may be higher than the light transmittance at planar areas of remaining portions of the display area DA except for portions at the first sensing area SA1, the second sensing area SA2 and the third sensing area SA3. In addition, the light transmittance at a planar area of the first sensing area SA1 may be higher than the light transmittance at planar areas of the second sensing area SA2 and the third sensing area SA3, respectively.

Figure 10:
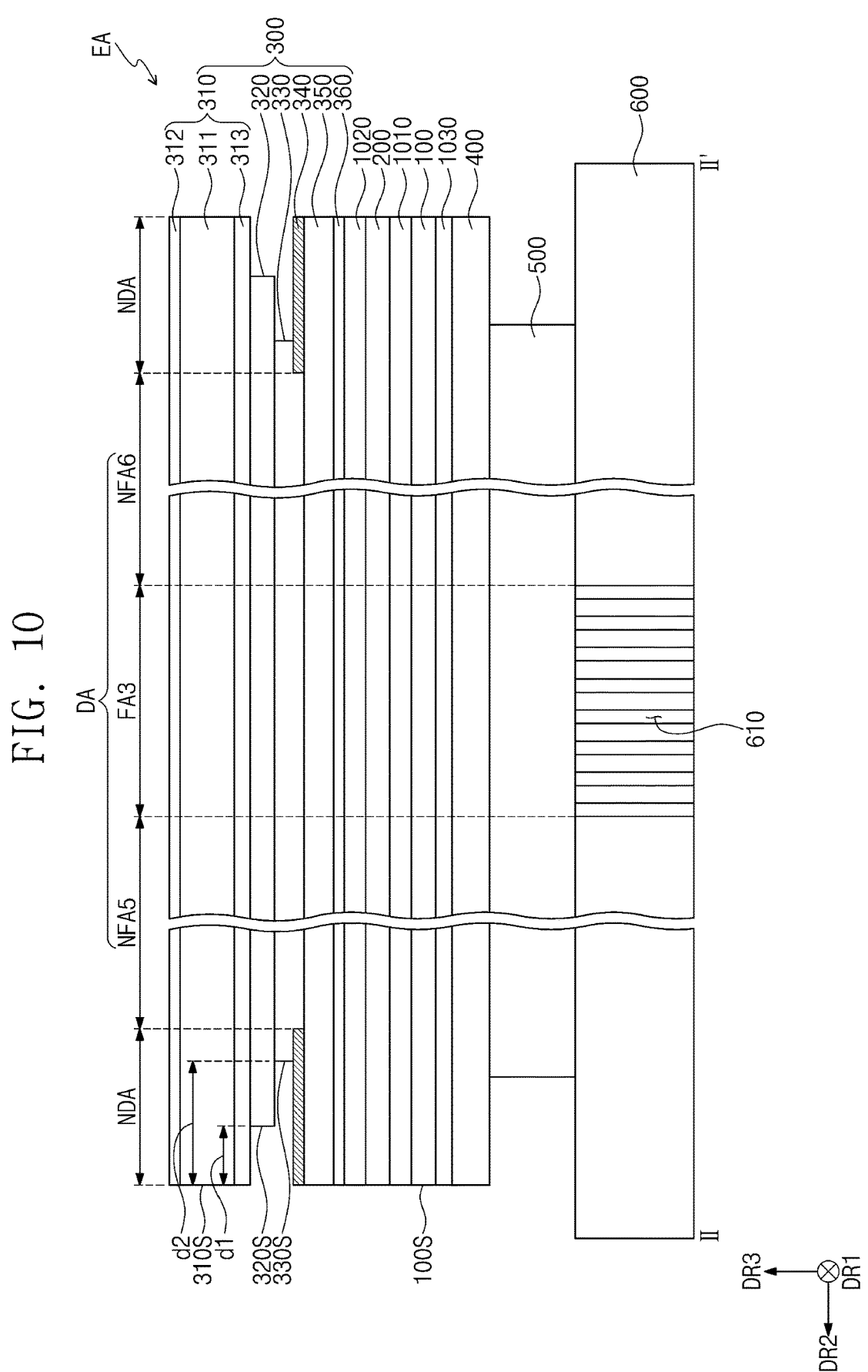
FIG. 10 is a cross-sectional view of an embodiment of an electronic device taken along line II-II' of FIG. 9A.
Figure 11:
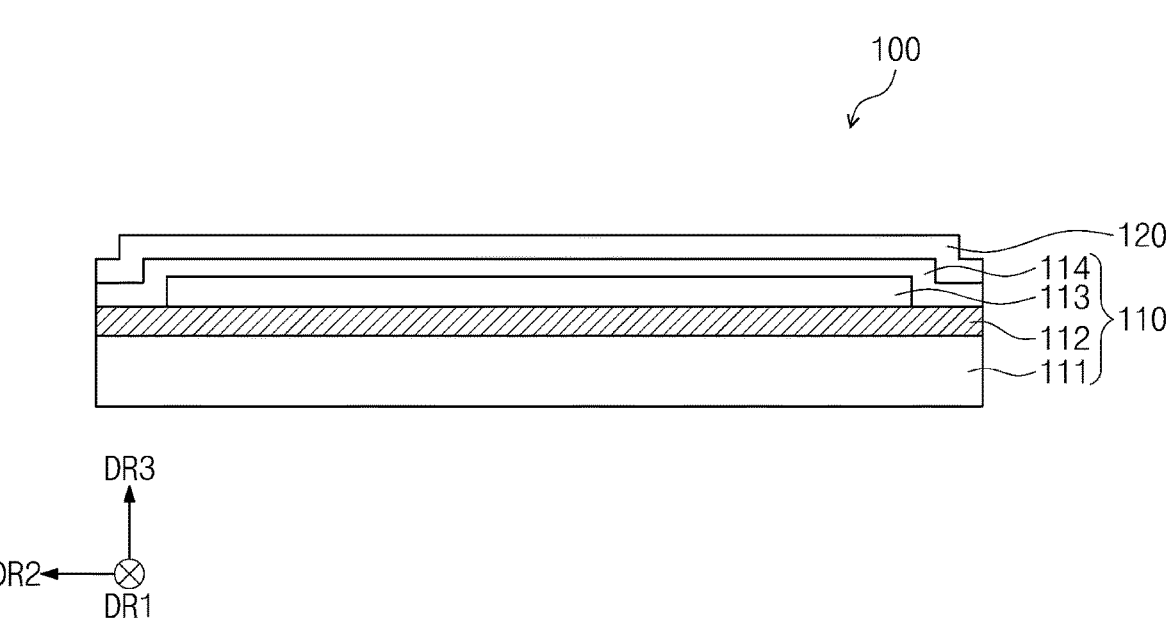
FIG. 11 is a cross-sectional view of an embodiment of a display panel.

FIG. 10 is a cross-sectional view of an embodiment of an electronic device EA taken along line II-II' of FIG. 9A. FIG. 11 is a cross-sectional view of an embodiment of an electronic device EA.

Referring to FIG. 10, the electronic device EA may include a display panel 100, an upper module (e.g., upper panel) and a lower module (e.g., lower panel).

Referring to FIG. 11, the display panel 100 may generate an image IM and sense an input TC applied from outside the display panel 100. In an embodiment, for example, the display panel 100 may include a display layer 110 and an input sensing layer 120. A thickness of the display panel 100 may be about 30 μm, and is not limited thereto.

The display layer 110 may generate an image IM, generate and emit light, etc. The display layer 110 may be a light emitting display layer, for example, the display layer 110 may be an organic light emitting display layer, a quantum dot display layer or a micro light emitting diode ("LED") display layer.

The display layer 110 may include a display base layer 111, a circuit layer 112, a light emitting element layer 113 and an encapsulation layer 114.

The display base layer 111 may include a synthetic resin film. The synthetic resin layer may include a thermosetting resin. The display base layer 111 may have a multi-layer structure. In an embodiment, for example, the display base layer 111 may have a three-layer structure of a synthetic resin layer, an adhesive layer and a synthetic resin layer. The synthetic resin layer may be a polyimide-based resin layer (e.g., including polyimide), and the material is not particularly limited. The synthetic resin layer may include at least one of an acryl-based resin, a methacrylate-based resin (e.g., including methacrylate), polyisoprene, a vinyl-based resin (e.g., including vinyl), an epoxy-based resin, a urethane-based resin, a cellulose-based resin (e.g., including cellulose), a siloxane-based resin (e.g., including siloxane), a polyamide-based resin and a perylene-based resin (e.g., including perylene). In addition, the display base layer 111 may include a glass substrate or an organic/inorganic material substrate.

The circuit layer 112 may be disposed on the display base layer 111. The circuit layer 112 may include an insulating layer, a semiconductor pattern, a conductive pattern and a signal line. In an embodiment, the insulating layer, the semiconductor layer and the conductive layer may be provided or formed as preliminary layers on the display base layer 111 by a method such as coating or vapor deposition, and then the preliminary layers of the insulating layer, the semiconductor layer and the conductive layer may be selectively patterned through a photolithography process. Thereafter, a semiconductor pattern, a conductive pattern and a signal line included in the circuit layer 112 may be provided or formed as respective patterns of the preliminary layer.

The light emitting element layer 113 may be disposed on the circuit layer 112. The light emitting element layer 113 may include a light emitting element or a display element. In an embodiment, for example, the light emitting element layer 113 may include an organic light emitting material, a quantum dot, a quantum rod or a micro LED.

The encapsulation layer 114 may be disposed on the light emitting element layer 113. The encapsulation layer 114 may include an inorganic layer, an organic layer and an inorganic layer that are sequentially stacked, but the layers of the encapsulation layer 114 are not limited thereto.

The inorganic layers may protect the light emitting element layer 113 from moisture and oxygen, and the organic layer may protect the light emitting element layer 113 from foreign substances such as dust particles. The inorganic layers may include a silicon nitride layer, a silicon oxy nitride layer, a silicon oxide layer, a titanium oxide layer or an aluminum oxide layer. The organic layer may include an acryl-based organic layer, but is not limited thereto.

The input sensing layer 120 may be disposed on the display layer 110. The input sensing layer 120 may sense an external input applied from the outside such as the input TC discussed above.

In an embodiment, the input sensing layer 120 may be provided or formed on the display layer 110 through a continuous process. The input sensing layer 120 provided through the continuous process may be indicated as being directly disposed on the display layer 110. Directly disposed may indicate that a third component is not disposed (e.g., omitted) between the input sensing layer 120 and the display layer 110. That is, a separate adhesive member may not be disposed between the input sensing layer 120 and the display layer 110.

Referring back to FIG. 10, an upper module may be disposed on the display panel 100. In an embodiment, for example, the upper module may include an anti-reflection layer 200 and an upper functional layer 300. The anti-reflection layer 200 may have a structure substantially similar to the anti-reflection layer RPL shown in FIGS. 4 and 5. Therefore, repeated descriptions are omitted.

The anti-reflection layer 200 may reduce reflectance of external light incident from outside the electronic device EA. The anti-reflection layer 200 may include a stretched synthetic resin film. In an embodiment, for example, the anti-reflection layer 200 may be provided by dyeing an iodine material on a polyvinyl alcohol ("PVA") film. However, this is merely an example, and the material of the anti-reflection layer 200 is not limited to the above example. A thickness of the anti-reflection layer 200 may be about 31 μm, and is not limited thereto.

The anti-reflection layer 200 may be bonded to the display panel 100 through a first adhesive layer 1010. The first adhesive layer 1010 may be a transparent adhesive layer such as a pressure-sensitive adhesive film, an optically clear adhesive film or an optically clear adhesive resin. The first adhesive layer 1010 that will be described below may include a conventional adhesive agent or a gluing agent. A thickness of the first adhesive layer 1010 may be about 25 μm, and is not limited thereto.

In an embodiment, the first adhesive layer 1010 may be omitted, such that the anti-reflection layer 200 may be directly disposed on the display panel 100. Where the anti-reflection layer 200 is directly disposed on the display panel 100, a separate adhesive member may not be disposed between the anti-reflection layer 200 and the display panel 100.

The upper functional layer 300 may be disposed on the anti-reflection layer 200. The upper functional layer 300 may include a protective layer 310 (e.g., upper protective layer), a window 320, an upper adhesive layer 330, a light blocking layer 340, a shock absorbing layer 350, and an upper hard coating layer 360. The components included in the upper functional layer 300 are not limited to the components described above. At least some of the components described above may be omitted, and other components may be added.

Referring to FIGS. 9A, 9B and 10, layers of the electronic device EA may be foldable and unfoldable. In an embodiment, for example, the protective layer 310, the window 320 and the display panel 100 are foldable and unfoldable. The protective layer 310, the window 320 and the display panel 100 may be foldable and unfoldable together as the electronic device EA is folded or unfolded.

The protective layer 310 may include a base layer 311, a surface coating layer 312, and an adhesive layer 313. The protective layer 310 has a structure substantially similar to the protective layer PL shown in FIGS. 6 to 8. Therefore, repeated descriptions are omitted.

The surface coating layer 312 may be a layer defining an outermost surface of the electronic device EA, e.g., a front surface which is furthest along the third direction DR3 from the display panel 100. The surface coating layer 312 may include a hard coating material HC (refer to FIG. 8) and an anti-fingerprint material AF (refer to FIG. 8) which is added to the hard coating material HC. The surface coating layer 312 has a single film structure. That is, the surface coating layer 312 includes one layer including a hard coating material HC and an anti-fingerprint material AF. Therefore, the surface coating layer 312 may have anti-fingerprint characteristics, anti-pollution characteristics and scratch-resistant characteristics. In addition, since the surface coating layer 312 itself has an anti-fingerprint function, a separate layer having an anti-fingerprint function may not be further provided on the surface coating layer 312. Accordingly, exterior defects of the protective layer 310 (e.g., a phenomenon in which the anti-fingerprint layer is peeled off) may be reduced or effectively prevented.

The adhesive layer 313 may be disposed under the base layer 311, and the protective layer 310 and the window 320 may be bonded to each other by the adhesive layer 313. The adhesive layer 313 has a structure substantially similar to adhesive layer AL shown in FIGS. 6 and 7. Therefore, repeated descriptions are omitted.

The window 320 may be disposed under the protective layer 310. The window 320 may include an optically transparent insulating material. In an embodiment, for example, the window 320 may include a glass substrate or a synthetic resin film. When the window 320 is a thin film glass, the thickness of the window 320 may be about 80 μm, for example, about 30 μm, but is not limited thereto. The window 320 has a structure substantially similar to the window WM shown in FIGS. 4 to 6. Therefore, repeated descriptions are omitted.

The upper adhesive layer 330 may be disposed under the window 320. The window 320 and the shock absorbing layer 350 may be bonded to each other by the upper adhesive layer 330. The thickness of the upper adhesive layer 330 may be about 35 μm, but is not limited thereto. The upper adhesive layer 330 may have a structure substantially similar to adhesive film ADL shown in FIGS. 4 to 6. Therefore, repeated descriptions are omitted.

In an embodiment, a fourth sidewall 320S of the window 320 and a fifth sidewall 330S of the upper adhesive layer 330 may be disposed inwardly from sidewalls of other layers. In an embodiment, for example, the fourth sidewall 320S and the fifth sidewall 330S disposed inwardly from a sixth sidewall 100S of the display panel 100 and a seventh sidewall 310S of the protective layer 310. Being disposed inwardly may indicate being closer to the display area DA than other comparison objects.

A folding operation of the electronic device EA may change the positional relationship between respective layers. According to an embodiment, since the electronic device EA which is unfolded or flat positions the fourth sidewall 320S of the window 320 is disposed inwardly from the sixth sidewall 100S of the display panel 100 and from the seventh sidewall 310S of the protective layer 310, even when the positional relationship is changed, the chances that the fourth sidewall 320S of the window 320 protrudes further than the seventh sidewall 310S of the protective layer 310 may be reduced. That is, the electronic device EA which is folded maintains the positions of the fourth sidewall 320S of the window 320 disposed inwardly from the sixth sidewall 100S of the display panel 100 and from the seventh sidewall 310S of the protective layer 310, even though the positional relationship is changed. Therefore, the chances that external shocks are delivered through the fourth sidewall 320S of the window 320 may be reduced. As a result, the chances of having cracks in the window 320 may be reduced.

A first distance d1 between corresponding ends or outer side surfaces of the fourth sidewall 320S of the window 320 and the seventh sidewall 310S of the protective layer 310 may be greater than or equal to a predetermined value. The first distance d1 may refer to a distance along the protective layer 310 (e.g., in a direction parallel to the first direction DR1 and/or the second direction DR2). In addition, the first distance d1 may correspond to the distance between the seventh sidewall 310S and the fourth sidewall 320S along the plane defined by the first direction DR1 and the second direction DR2 crossing each other.

The first distance d1 may be about 196 μm, but is not limited thereto. In an embodiment, for example, the first distance d1 may be about 50 μm to about 300 μm. When the first distance d1 increases, the protective layer 310 protrudes further than the window 320, and an extended portion of the protective layer 310 may be bent to be attached to other components, for example, a case (not shown) of the electronic device EA. In addition, when a total planar area of the protective layer 310 increases, the chances that foreign substances flowing from an upper portion of the protective layer 310 are introduced into a lower portion of the protective layer 310 may be reduced. The first distance d1 may be substantially similar to the first width W1 described above. Therefore, repeated descriptions are omitted.

In addition, the window 320 and the upper adhesive layer 330 may be bonded to the shock absorbing layer 350 such as through a lamination process. In consideration of the lamination process tolerance, the planar areas of the window 320 and the upper adhesive layer 330 may be smaller than the planar area of the shock absorbing layer 350. In addition, the planar area of the upper adhesive layer 330 may be smaller than the planar area of the window 320. In an embodiment, for example, pressure may be applied to the upper adhesive layer 330 in the process of attaching the window 320 to underlying layers of the electronic device EA. The upper adhesive layer 330 may be expanded along the first direction DR1 and/or the second direction DR2 by the pressure. Where the upper adhesive layer 330 expands, the original planar area of the upper adhesive layer 330 may be smaller than or equal to the planar area of the window 320 to reduce or effectively prevent expansion of the upper adhesive layer 330 further than edges of the window 320.

A second distance d2 between corresponding ends or outer side surfaces of the fifth sidewall 330S of the upper adhesive layer 330 and the seventh sidewall 310S of the protective layer 310 may be greater than or equal to a predetermined distance. The second distance d2 may indicate a distance along the protective layer 310. In addition, the second distance d2 may correspond to the distance between the seventh sidewall 310S and the fifth sidewall 330S on a plane.

The second distance d2 may be about 392 μm, but is not limited thereto. In an embodiment, for example, the second distance d2 may be between about 292 μm and about 492 μm, but is not limited thereto. In an embodiment, the second distance d2 may be greater than the first distance d1, however, is not limited thereto. That is, the second distance d2 may be greater than or equal to the first distance d1. The second distance d2 may be substantially similar to the second width W2 described above. Therefore, repeated descriptions are omitted.

The light blocking layer 340 may be disposed between the shock absorbing layer 350 and the upper adhesive layer 330. The light blocking layer 340 may be provided by being printed on an upper surface of the shock absorbing layer 350. The light blocking layer 340 may overlap the non-display area NDA. The light blocking layer 340 is a colored layer and may be provided or formed by a coating method. The light blocking layer 340 may include a colored organic material or an opaque metal, and the materials of the light blocking layer 340 are not limited thereto.

FIG. 10 illustrates that the light blocking layer 340 is disposed on the upper surface of the shock absorbing layer 350, but the position of the light blocking layer 340 is not limited thereto. In an embodiment, for example, the light blocking layer 340 may be provided on an upper surface of the protective layer 310, a lower surface of the protective layer 310, an upper surface of the window 320 and/or a lower surface of the window 320. In addition, the light blocking layer 340 may be provided as a plurality of layers. The light blocking layer 340 as a plurality of layers may include first light blocking layers provided on the upper surface of the shock absorbing layer 350, and second light blocking layers provided on the upper surface of the protective layer 310, the lower surface of the protective layer 310, the upper surface of the window 320 and/or the lower surface of the window 320.

The shock absorbing layer 350 may be a functional layer for protecting the display panel 100 from external shocks. The shock absorbing layer 350 may be selected from films having an elastic modulus of about 1 GPa or greater at room temperature. The shock absorbing layer 350 may be a stretched film including an optical function. In an embodiment, for example, the shock absorbing layer 350 may be an optical axis control film. A thickness of the shock absorbing layer 350 may be about 41 μm, but is not limited thereto. In an embodiment, the shock absorbing layer 350 may be omitted.

The upper hard coating layer 360 may be provided on the surface of the shock absorbing layer 350. The shock absorbing layer 350 may include a curved surface. The upper surface of the shock absorbing layer 350 may be in contact with the upper adhesive layer 330. Therefore, the curvature of the upper surface of the shock absorbing layer 350 may be filled by the upper adhesive layer 330. Accordingly, an optical issue on the upper surface of the shock absorbing layer 350 may be reduced or effectively prevented.

The upper functional layer 300 may be bonded to the anti-reflection layer 200 through a second adhesive layer 1020. The second adhesive layer 1020 may include a conventional adhesive agent or a gluing agent. A thickness of the second adhesive layer 1020 may be about 25 μm, and is not limited thereto.

A lower module may be disposed under the display panel 100. In an embodiment, for example, the lower module may include a lower protective film 400 (e.g., lower protective layer), a cushion functional layer 500 (e.g., cushion layer), and a support layer 600. Components constituting the lower module are not limited to the components described above. At least some of the components described above may be omitted, and other components may be added.

The lower protective film 400 may be bonded to the rear surface of the display panel 100 through a third adhesive layer 1030. The lower protective film 400 may reduce or effectively prevent scratching of the rear surface of the display panel 100 such as during the manufacturing process of the display panel 100. The lower protective film 400 may be a colored polyimide film. In an embodiment, for example, the lower protective film 400 may be an opaque yellow film, but is not limited thereto.

A thickness of the lower protective film 400 may be about 40 μm, and a thickness of the third adhesive layer 1030 may be about 18 μm. However, the thickness of the lower protective film 400 and the thickness of the third adhesive layer 1030 are not limited thereto.

The cushion functional layer 500 may be disposed under the lower protective film 400. The cushion functional layer 500 may protect the display panel 100 from shocks delivered from the lower portion of the electronic device EA. Shock resistance characteristics of the electronic device EA may be improved by the cushion functional layer 500.

The support layer 600 may be disposed under the cushion functional layer 500. That is, the support layer 600 may face the display panel 100 with the cushion functional layer 500 therebetween. The support layer 600 may include a material having an elastic modulus of about 60 GPa or greater at room temperature. In an embodiment, for example, the support layer 600 may be SUS304, but is not limited thereto. The heat dissipation performance of an electronic device EA may be improved by the support layer 600 (e.g., heat dissipation member).

An opening 610 may be defined in a portion of the support layer 600. The opening 610 may be defined in an area overlapping the third folding area FA3. In a view along the third direction DR3, the opening 610 may overlap the third folding area FA3. The support layer 600 may be deformable at the third folding area FA3 owing to the opening 610 defined in the support layer 600.

A thickness of the support layer 600 may be about 150 μm, but the thickness of the support layer 600 is not limited to the value described above.

According to one or more embodiment, provision of a protective layer PL on a window WM including a thin glass in a display device, may reduce or effectively prevent damage to the window WM.

In addition, the protective layer PL includes a surface coating layer SCL having a single film structure in which an anti-fingerprint material AF is added to a hard coating material HC inside the surface coating layer SCL. Therefore, compared to a structure in which an anti-fingerprint layer is provided on the surface coating layer SCL, exterior reliability of the protective layer PL may be improved.

Although the invention has been described with reference to embodiments, it will be understood that various changes and modifications can be made by those skilled in the art without departing from the spirit and scope of the invention. In addition, the embodiments are not intended to limit the technical spirit of the invention, and the scope of the disclosure is not to be limited by the above embodiments but by the claims and the equivalents thereof.

What is claimed is:

1. A display device comprising:
   a display panel which generates an image and includes an active area at which the image is displayed;
   a window facing the display panel and through which the image is transmitted, the window including a glass material; and
   a protective layer facing the display panel with the window therebetween, wherein each of the display panel, the window and the protective layer includes opposing sidewalls facing each other, and in a direction along the display panel, the opposing sidewalls of the window are closer to the active area than the opposing sidewalls of the display panel and the opposing sidewalls of the protective layer, respectively.

2. The display device of claim 1, wherein the protective layer, the window and the display panel are foldable and unfoldable.

3. The display device of claim 2, wherein the protective layer comprises in order from the window:

a base layer; and a surface coating layer having a single film structure, wherein the surface coating layer comprises an impact resistance layer.

4. The display device of claim 3, wherein the window has a thickness of about 80 micrometers or less.

5. The display device of claim 4, wherein the surface coating layer has a thickness of about 3 micrometers to about 10 micrometers.

6. The display device of claim 5, wherein the surface coating layer has a surface contact angle of about 100 degrees to about 120 degrees.

7. The display device of claim 1, wherein a sidewall among the opposing sidewalls of the window is spaced apart from a corresponding sidewall among the opposing sidewalls of the protective layer by a first width, and the first width is about 196 micrometers to about 300 micrometers.

8. The display device of claim 1, further comprising an adhesive layer between the display panel and the window, wherein the adhesive layer faces the protective layer with the window therebetween.

9. The display device of claim 8, wherein the adhesive layer includes a sidewall, and in the direction along the display panel, the sidewall of the adhesive layer is closer to the active area than the corresponding sidewall of the protective layer.

10. The display device of claim 9, wherein a sidewall among the opposing sidewalls of the window is spaced apart from a corresponding sidewall among the opposing sidewalls of the protective layer by a first width, the sidewall of the adhesive layer is spaced apart from the corresponding sidewall of the protective layer by a second width, and the second width is greater than or equal to the first width.

11. The display device of claim 10, wherein the second width is greater than the first width, the first width is about 196 micrometers to about 300 micrometers, and the second width is about 292 micrometers to about 492 micrometers.

12. The display device of claim 1, wherein the protective layer has an elastic modulus of about 4.0 gigapascals to about 5.5 gigapascals.

13. The display device of claim 12, wherein the protective layer includes an optical axis control stretched film including:

a first stretch axis having an elastic modulus, and a second stretch axis having an elastic modulus, and a difference between the elastic modulus along the first stretch axis and the elastic modulus along the second stretch axis is less than about 2 gigapascals.

14. The display device of claim 3, wherein the base layer comprises:

a base material; and an ultraviolet light blocking material within the base material.

15. The display device of claim 14, wherein the protective layer has a transmission of less than about 20% with respect to ultraviolet rays having a wavelength of about 380 nanometers or less.

16. The display device of claim 15, wherein the base layer has a thickness of about 40 micrometers to about 70 micrometers.

17. The display device of claim 3, wherein the surface coating layer further comprises an anti-fingerprint material which is within the impact resistance layer.

18. The display device of claim 17, wherein the anti-fingerprint material has a weight ratio of greater than 0 weight percent to about 10 weight percent or less, with respect to a total weight of the surface coating layer.

19. The display device of claim 17, wherein the anti-fingerprint material comprises a water-repellent material or an oil-repellent material.

20. The display device of claim 7, wherein the first width is greater than thickness of the window.

* * * * *